United States Patent [19]

Nishizawa

[11] Patent Number: 4,975,755

[45] Date of Patent: * Dec. 4, 1990

[54] OPTICALLY CONTROLLABLE STATIC INDUCTION THYRISTOR DEVICE

[75] Inventor: Junichi Nishizawa, Miyagi, Japan

[73] Assignee: Handotai Kenkyu Shinkokai, Miyagi, Japan

[*] Notice: The portion of the term of this patent subsequent to Mar. 28, 2006 has been disclaimed.

[21] Appl. No.: 247,832

[22] Filed: Sep. 22, 1988

Related U.S. Application Data

[60] Division of Ser. No. 8,059, Jan. 9, 1987, Pat. No. 4,816,891, which is a continuation of Ser. No. 435,449, Oct. 20, 1982, abandoned, which is a continuation of Ser. No. 133,747, Mar. 25, 1980, abandoned.

[30] Foreign Application Priority Data

Mar. 26, 1979 [JP] Japan .................................. 54-36079

[51] Int. Cl.$^5$ ....................... H01L 29/74; H01L 27/14
[52] U.S. Cl. ........................................ 357/38; 357/22; 357/30; 357/20; 357/51

[58] Field of Search ....................... 357/20, 22, 30, 38, 357/51, 23.1; 307/641

[56] References Cited

U.S. PATENT DOCUMENTS

| 3,356,862 | 12/1967 | Diebold et al. | 357/38 |
| 3,896,477 | 7/1975 | Hutson | 357/38 |
| 4,223,328 | 9/1980 | Terasawa et al. | 357/38 |
| 4,816,891 | 3/1989 | Nishizawa | 357/38 |

Primary Examiner—Rolf Hille
Assistant Examiner—Peter Toby Brown
Attorney, Agent, or Firm—Sughrue, Mion, Zinn, Macpeak & Seas

[57] ABSTRACT

A semiconductor device comprises a static induction thyristor and a photosensitive element connected to a gate of the static induction thyristor so that the static induction thyristor is controlled optically. A plurality of the semiconductor devices are easily connected in series and/or in parallel with each other to control a large current and/or voltage.

20 Claims, 8 Drawing Sheets

OPTICALLY CONTROLLABLE STATIC INDUCTION THYRISTOR DEVICE

BACKGROUND OF THE INVENTION

This is a Division of pending application Ser. No. 008,059, filed Jan. 9, 1987, which is a Continuation of application Ser. No. 435,449, filed Oct. 20, 1982, now abandoned, which is a continuation of application Ser. No. 133,747, filed Mar. 25, 1980, now abandoned.

(a) Field of the Invention:

The present invention relates to a semiconductor device including at least one static induction thyristor and a photosensitive control element connected to a gate thereof.

(b) Description of the prior art:

The conventional thyristor which, basically, is formed by a four-layer structure of pnpn has the drawbacks that it is difficult to carry out switching-off action only by a control of gate voltage, and that even when the switching-off is carried out only by this gate voltage, its speed is very slow. In contrast thereto, a static induction thyristor (hereinafter to be called SIT) which is basically constructed by a gated diode structure, i.e. an anode region, cathode region and gate means integrated in either the anode or cathode region, has the features that switching-off operation by the gate voltage is easy, and that its switching-off time is short.

Typical structural examples of the conventional SIT are illustrated in FIGS. 1A to 1E.

FIGS. 1A and 1B are sectional views of the SIT having a surface gate structure and FIG. 1C shows a sectional view of the SIT having an embedded gate structure. In the figures, p+ regions 11 and 14 represent an anode region and a gate region. respectively. An n+ type region 13 represents a cathode region. An n− type region 12 represents a region for constituting a channel. Numerals 11', 13' and 14' represent an anode electrode, a cathode electrode, and a gate electrode, respectively which may be made of a layer of Al, Mo, W, Au or other metals, or a low resistivity polysilicon, or their composite layer structure. Numeral 15 represents an insulating layer made of $SiO_2$, $Si_3N_4$, $Al_2O_3$, AlN or like substances, or their mixture, or their composite insulating layer. An n region 16 is of relatively high impurity density, whose thickness is small. The region 16 is to restrict the hole injection from the anode.

In FIG. 1D which shows a cross section of the SIT having an insulating gate structure, a p+ region 21 and an i region 22 are an anode region and a region constituting a channel, respectively, and n+ regions 23 and n region 27 are cathode regions and regions for restricting hole injection from an p+ region 21, respectively. p regions 28 extend vertically with respect to the drawing sheet and reach the surface of the wafer at a suitable position so that they can be connected through electrodes to for example, the cathode region. A reference numeral 25 is the previously mentioned insulating layer. Reference numerals 21', 23' and 24 are the anode electrodes, the cathode electrodes and the insulating gate electrodes, respectively, which were mentioned before.

For example, the p+ gate region 14 in FIG. 1A to 1C is formed in a striped or mesh pattern in plan view.

The distance between the adjacent p+ gate regions 14 and the impurity density of, for example, the n− regions (in the vicinity of the p+ gate region) are selected such that when a predetermined negative voltage is applied to at least the p+ gates the n− regions between the p+ gate region 14 becomes completely depleted and there is a high potential barrier formed in a front face of the cathode. Further it is designed such that even when the maximum forward blocking voltage is applied, the depletion layer extending from the p+ gate region 14 does not extend to the anode region so that there is a neutral region of a predetermined thickness left in the n− region or n region 16 in front of the anode region.

The operation of the SIT thus constructed and the sizes and impurity densities of the respective regions thereof are disclosed in detail in Japanese Patent Application No. 54-8366 of the present applicant.

Since, in the SIT, the switching between conduction and non-conduction is controlled by controlling the potential distribution in the vicinity of the cathode thereof by the gate voltage, it is easy to cut-off d.c. current at a high speed. In the structure shown in FIG. 1A it is possible to design an SIT whose forward blocking voltage is of substantially the same order as that of the reverse breakdown voltage. In the structure shown in FIG. 1B, 1C or 1D, on the other hand, the same forward blocking voltage as that of the SIT in FIG. 1A can be achieved by using a structure (i.e., the entire structure shown in each of those figures) whose thickness is substantially half of the thickness of the element in FIG. 1A. Further, the operation speed is high and the forward voltage drop is small which are advantageous. However, the reverse breakdown voltage thereof is small. Therefore, in order to use the SIT having the structure shown in FIG. 1B, 1C or 1D in some device which requires high reverse breakdown voltage, it is usual to connect a Schottky diode or the like in series therewith.

In order to improve the temperature characteristics of the SIT, it may be advisable to employ the opposite conduction type structure. That is, this structure may be provided by substantially regularly and selectively changing the p+ anode region 11 or 21 to n regions and connecting them through electrodes. One example of such structure is shown in FIG. 1E. In FIG. 1E, the resistance of portions of the n region 16 which are parallel to the anode surface and adjacent to the n+ regions 20 is selected such that there is substantially no voltage drop when electrons thermally excited in the high resistance i region 12 flow thereinto.

FIGS. 2A and 2B show symbol markings of the junction type SIT and the insulating gate type SIT, respectively. As shown, each of these SITs has a diode in the drain side thereof.

FIGS. 3A and 3B shows two examples of typical structures of conventional photo-sensitive semiconductor elements, in which FIG. 3A shows a photo-conductive element and FIG. 3B shows a photo-transistor.

In FIG. 3A, an i region 32 whose resistance is very high and which can be considered an insulator is formed on an n+ region 31. On both sides thereof, ohmic electrodes 31' and 32' are formed, respectively. The electrodes are, in this example, of $In_2O_2$ or $SnO_2$ which are transparent materials. A lower resistance polysilicon may also be used for them. When the electrode 32' is hardly provided directly, it may be advisable to convert a thin surface portion of the i region 32 into n+ region and then the transparent electrode 32' may be formed thereon.

When the element is illuminated resulting in electron-hole pairs in the i region 32, an electric current will flow. In FIG. 3A, when the electrode 32' is a Schottky electrode, the element may operate as a Schottky diode which is responsive to incident light L with a voltage application thereto being such that the potential at the Schottky electrode side is lower than that at the ohmic electrode 31'.

In FIG. 3B, which shows the photo-transistor, an n+ region 44, a p region 43, an n⁻ region 42 and an n+ region 41 form an emitter region, a base region, a high resistance layer and a collector region, respectively. The photo-transistor has transparent electrodes 41' and 44' for a collector electrode and an emitter electrode, respectively. The n+ region 44 and the p region 43 are thin similar to those of the usual bipolar transistor.

Most of the incident light is absorbed by the n⁻ region 42. When a positive voltage is applied to the collector electrode 41', electrons excited by the light flow into the n+ collector region and are absorbed therein.

On the contrary, hole flow into the p base region, which is a floating region, and accumulate therein. When the accumulated holes become excessive, the p base region 43 is positively charged and so the potential barrier thereof against electrons in the base region is lowered, resulting in that electrons flow from the emitter region to the base region from which they flow into the collector region. In other words, the photo-transistor becomes conductive with light.

In FIG. 3C which shows a thyristor, an n+ region 55 and a p+ region 51 form a cathode region and an anode region, respectively. A transparent electrode 55' is provided on the cathode region 55 and an anode electrode 51' is formed on the anode region 51.

When a positive voltage is applied to the anode electrode 51' and the cathode is illuminated with light L, electrons and holes photo-excited in an i region flow into an n region 52 and a p region 54, respectively. Therefore, the n region 52 is negatively changed and the p region 54 is positively changed. Consequently the barrier potentials against the cathode and anode regions respectively, are lowered and electrons and holes are injected from the cathode and anode regions thereto, respectively, resulting in a conduction state of the thyristor.

Since the thyristor in FIG. 3C has multiplication mechanisms for carrier injection on both sides thereof, the photo-sensitivity thereof is very high.

FIG. 3D shows a p+-i-n+ photo-diode having a transparent electrode 63' and an electrode 61' to which a positive voltage is applied.

In each of the elements in FIGS. 3A to 3D, most of light is absorbed in the i region or n⁻ region to produce electron-hole pairs therein. Therefore, when the electric field strength in such region is selected as being slightly lower than the avalanche field strength, a large amount of carriers may be produced due to the avalanche multiplication mechanism. Therefore, the sensitivity may be more improved. As will be clear, the avalanche multiplication mechanism will disappear by lowering the voltage between the electrode even if the element is in a conductive state. It should be noted that the elements in FIGS. 3A to 3D are merely typical and simplest examples and there are many modifications thereof. The thicknesses of the high resistance regions 32, 42, 53 and 62 in the photo-sensitive devices in FIGS. 3A to 3D should be substantially on the order of the light penetrating depths thereinto in view of the highest efficiency. Another example of the photo-sensitive device may be the photovoltiac device.

The SIT and the photo-sensitive semiconductor elements have been described hereinbefore. Although the SIT is characterized by the large operating voltage and current and high switching speed, it is difficult to apply a single SIT in handling a large electric power such as the d.c. power transmission. The breakdown voltage of a single SIT is determined by the thickness of the n⁻ region or i region 12 in FIGS. 1A to 1D, because the electric field strength in at least this region must be weaker than the field strength at which the avalanche breakdown commences. This field strength may be around 200 KV/cm for Si. Further, the thickness of the region 12 is required to be equal to or smaller than the diffusion depth of electron and/or holes. However the maximum forward blocking voltage of the SIT is substantially determined by the semiconductor material to be used. For example when Si is used, the value may be around 5,000 to 10,000 volts. Therefore, it is necessary to connect a plurality of SITs each capable of carrying a current of such as 1,000 amperes in the conductive state and having the forward blocking voltage of, for example, 5,000 or 10,000 volts in series with each other to provide a sufficient breakdown voltage and to connect a plurality of the series connects SITs in parallel with each other to provide a sufficient current capacity. In this case, however, it becomes relatively difficult to control the thyristor array between conduction and non-conduction by using an electric signal. Therefore, it is proposed to control it optically.

SUMMARY OF THE INVENTION

An object of the present invention is to provide an optically controllable static induction thyristor.

Another object of the present invention is to provide an optically controllable static induction tyristor which is suitable to use in a series and/or parallel array.

DETAILED DESCRIPTION OF THE INVENTION

Figure 4A:
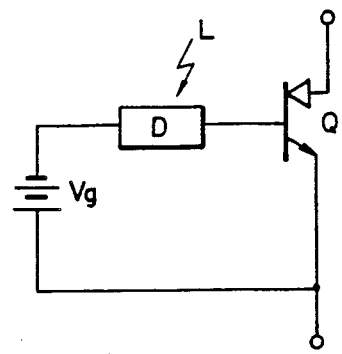
FIGS. 4A to 4E are SIT circuits each having a gate to which a photo-sensitive seminconductor is connected, showing embodiments of the present invention.

In FIG. 4A, a photo-sensitive semiconductor element D, which is any of the photo-sensitive semiconductor in FIGS. 3A to 3D, is connected to a gate of a static induction thyristor Q which is any of the SITs in FIGS. 1A to 1E. A biasing source Vg is connected to the element D in series therewith. The output voltage of the biasing source Vg should be selected according to the SIT to be used. For example, when the SIT selected is capable of blocking a forward voltage of 5,000 volts with a reverse gate bias of −30 volts, the voltage of the source Vg should be on the order −30 volts.

Since the photo-sensitive element D is conductive during illumination by light L, a voltage -Vg is applied to the gate of the SIT Q causing the latter to be non-conductive. When the illumination terminates, the element D becomes nonconductive. In this case, if a static capacitance of the element D is selected as being sufficiently smaller than the gate-source capacitance of the SIT, there is substantially no voltage applied to the gate of the SIT. Therefore, the SIT switches its state to conduction. Usually, the size of the element D is small compared with the SIT and therefore the static capacitance of the element D during non-conduction is very small compared with that of the gate of the SIT.

Figure 4B:
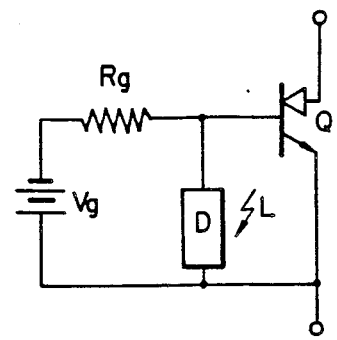

In FIG. 4B, the photo-sensitive element D is connected in parallel with the gate-source of the SIT.

Without light, a voltage, -Vg is applied to the gate of the SIT and the latter is in a non-conductive state. On the other hand, with light illumination, the element becomes conductive and thus the potential at the gate becomes substantially the same at that at the source of the SIT. Therefore, the latter becomes conductive. The resistance of the element D in the conductive state is selected as being sufficiently small compared with a resistor Rg connected in parallel to the biasing source Vg.

Figure 4C:
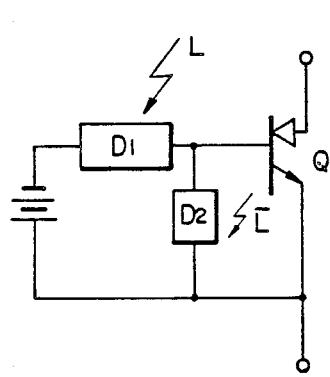
Figure 4D:
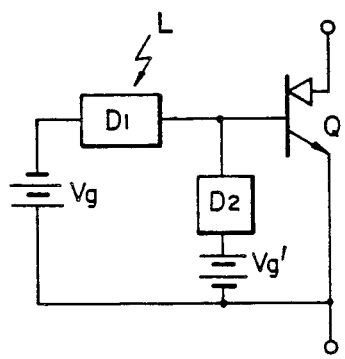

In FIG. 4C pair of the photo-sensitive elements $D_1$ and $D_2$ are connected in series and in parallel to the gate of the SIT, respectively. The light illuminations to the elements $D_1$ and $D_2$ are made complementary. That is, when the element $D_1$ is illuminated, the element $D_2$ is not illuminated and vice versa. Therefore, the element $D_1$ is switched on while the element $D_2$ is switched off or vice versa, and consequently the thyristor Q is switched off when the element $D_1$ is in the conductive state and switched on when the element $D_2$ is in the conductive state. In FIG. 4D, an additional power source Vg' is inserted in series with the element $D_2$ in FIG. 4C. This circuit arrangement is effective when the conductive state of the SIT is more clearly set or the SIT is of the MOS type. When the SIT is of the junction type, Vg' may be on the order of 1 volt. If the SIT is of the MOS type, the value of the power source Vg' may be much higher than 1 volt.

Figure 4E:
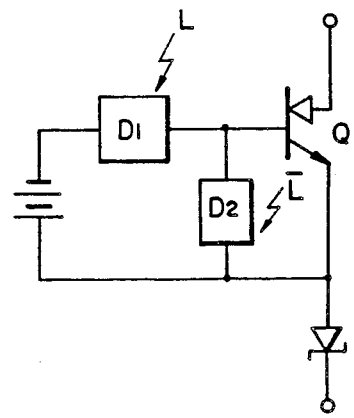

In the case where the reverse breakdown voltage of the SIT is not high, as in the case of the SIT having a structure in any of FIGS. 1A to 1D, and where it is required to have the reverse breakdown voltage during operation of the circuit, it is enough to connect in series a Schottky diode or pin diode having a desired reverse breakdown voltage to the SIT as shown in FIG. 4E.

Figure 5A:
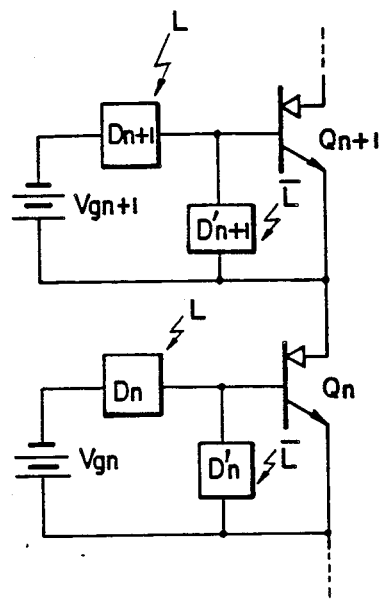
FIGS. 5A to 5B show other examples of the SIT circuits in FIGS. 4A to 4E.
Figure 5B:
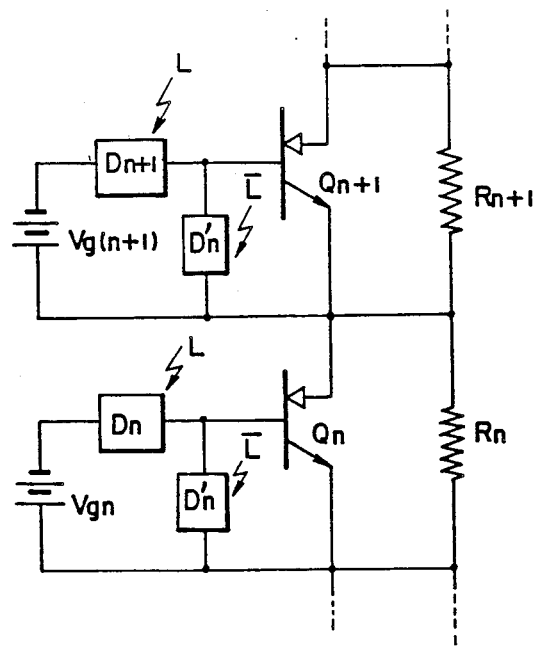

For example, when an AC to DC converter for a d.c. power transmission of one million volts is constructed using the SITs each having a maximum forward blocking voltage of 5,000 volts, the number of the SITs to be connected in series becomes at least 200. FIGS 5A and 5B show examples of the series connection of the plurality of the SITs which may be of either junction type of MOS type. Since the gates of these SITs are controlled optically, it is easy to control all the SITs simultaneously in synchronism. In this case the light illumination may be performed by using optical fibers etc. so that light signal is evenly supplied to the respective photo-sensitive elements of the SIT circuits. In any case, since the operations of the SITs are not extremely high, it may be possible to use instead of the bundle type optical fiber, the clad type optical fiber by which the light in cross sectional area thereof may become more even, although the bundle type optical fiber is effective to guide a triggering optical signal to the respective photo-sensitive elements.

In FIG. 5B, a resistor is further connected in parallel with each SIT. The resistors have the same resistance, i.e., $R_1 = R_2 \ldots = R_{n+1}$. The purpose of the provision of the parallel resistors $R_n$ is to make the voltage applied to the SITs equal when the SITs are in the non-conductive state. The resistance value of the resistor Ri should be as large as possible so long as it is smaller than the resistance between the anode and the cathode of the SIT in the non-conductive state. For example, the value may be 1M ohms although this value is not critical in every case.

Such series connection of the SITs as shown in FIGS. 5A and 5B in which the SIT circuit in FIG. 4C is used can also be effected for other SIT circuits shown in FIGS. 4A, 4B, 4D or 4E.

For further larger current application, a plurality of the series connections of the SITs in FIGS. 5A–5B are connected in parallel.

The SIT circuit in any of FIGS. 4A to 4D can be realized by making either one of the electrodes of the SIT in any of FIGS. 1A to 1E transparent so that light incident on the one surface can reach the high resistance region of the SIT. When Si is used as the semiconductor material for the SIT, the light penetrating depth required may be on the order of 10 to 30 μm. Therefore, in the case where the SIT structure shown in any of FIGS. 1A to 1E is used with a transparent anode electrode, the thickness of the p+ regions 11 or a sum of the thickness of the p+ region 11 and the n region 16 (or the p+ region 21 and the n region 27) should be as small as possible and at least sufficiently thinner than the light penetrating depth. For example, it may be advisable to select the thickness of the p region as being about 5 μm or smaller, the inpurity density as being about $1 \times 10^{19}$ cm$^{-3}$ or more, and the thickness of the n region 16 as being about 1 μm or smaller and the impurity density as being about $1 \times 10^{16}$ cm$^{-3}$ or more. The depth of the gate region depends upon the distance between adjacent gate regions and the impurity density of the high resistance region and is usually from several microns to 20 μm. Therefore, using a transparent electrode the SIT becomes controllable with light.

When it is impossible to sufficiently reduce the resistance of the transparent electrode of $In_2O_3$, $SnO_2$ or low resistance polysilicon, it is advisable to provide a metal electrode of a material such as Al in the form of a mesh or stripes at desired positions on the SIT.

The operation of the optically controllable SIT will be described using the structure in FIG. 1B.

Figure 1A:
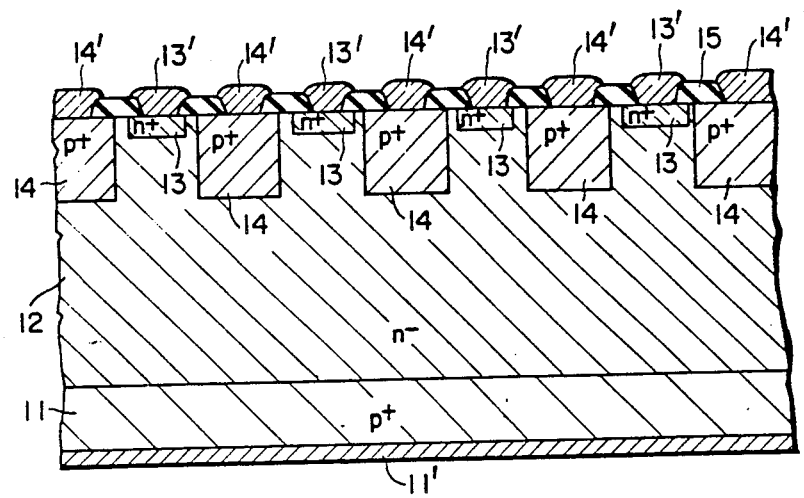
FIGS. 1A to 1E are cross sections showing examples of static induction thyristor.
Figure 1B:
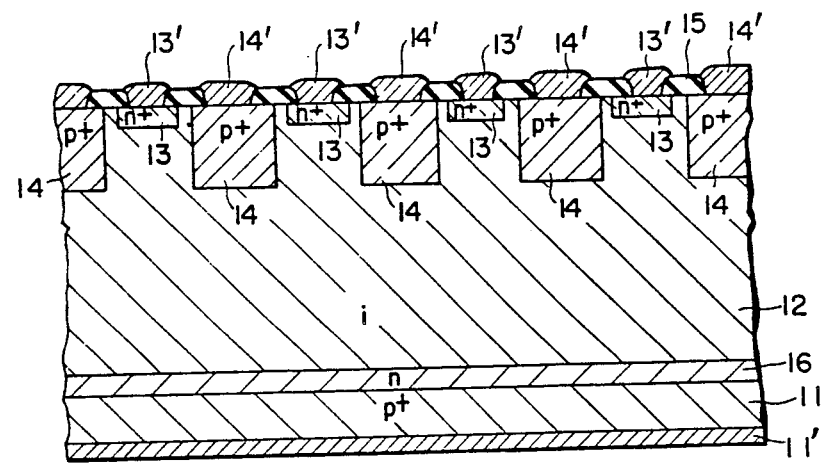
Figure 1C:
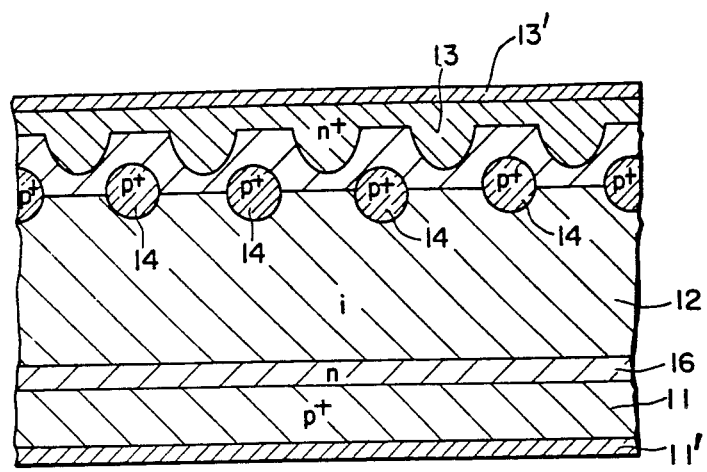
Figure 1D:
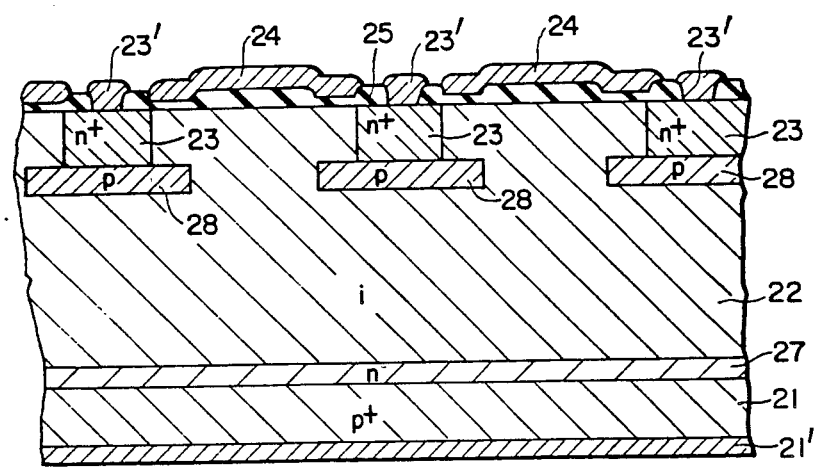
Figure 1E:
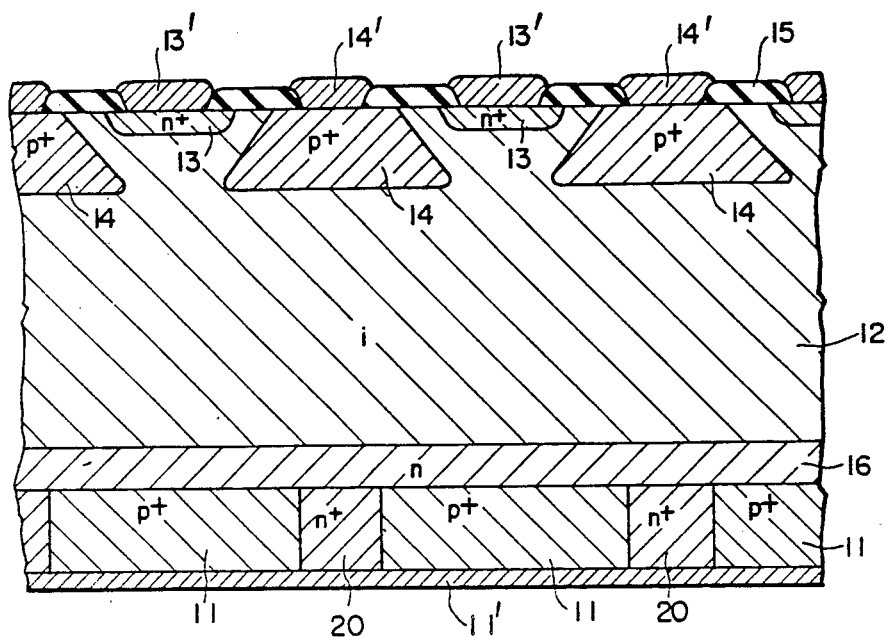
Figure 2A:
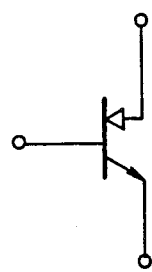
FIGS. 2A and 2B show symbol markings of the static induction thyristors.
Figure 2B:
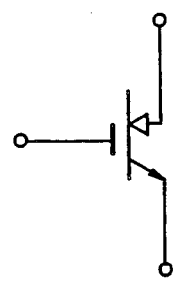
Figure 3A:
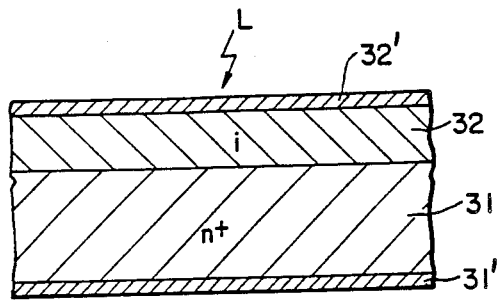
FIGS. 3A to 3D are cross sections showing the photo, conductive element, the photothyristor and the photodiode, respectively.
Figure 3B:
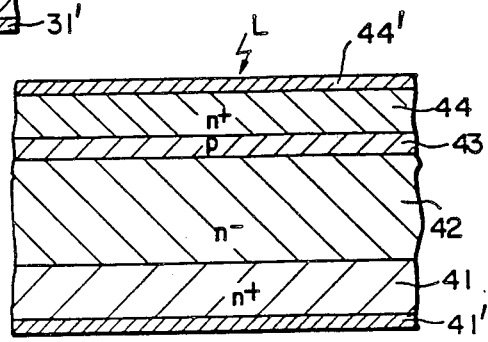
Figure 3C:
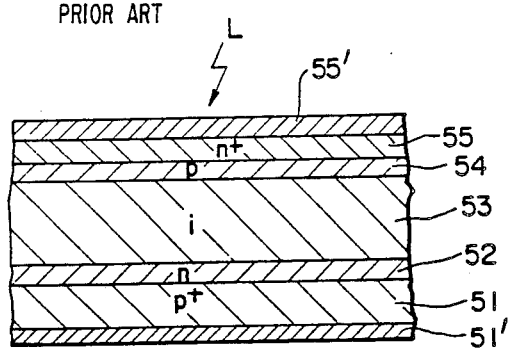
Figure 3D:
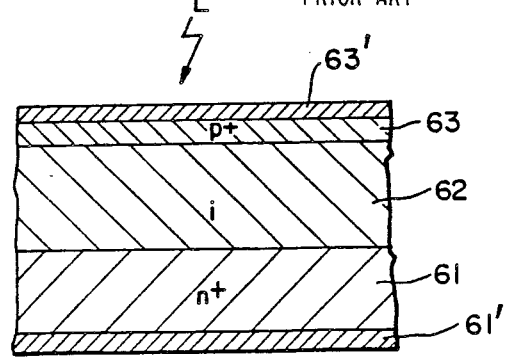

When the structure in FIG. 1B is irradiated with light from the transparent anode electrode, electron-hole pairs are produced in the i region 12. At this time, if a positive voltage is applied to the anode, electrons may flow into the n region 16 and charge the region negatively. When the amount of the negative charge in the region 16 increases to some extent, a hole injection may occur from the anode region. Thus, holes produced by optical excitation and holes thus injected flow towards the gate and cathode side. A major portion of holes may flow into the p+ gate region and a portion may flow into the cathode region.

When holes are accumulated in the p+ gate region, the latter is charged negatively, resulting in a lowering of the barrier for electrons formed at the front surface of the cathode. Consequently, electrons are injected thereto from the cathode and accumulated at the front surface of the anode, causing the hole injection from the anode to be enhanced. As a result, the SIT becomes conductive.

In order to lower the forward drop of the SIT in the conductive state, it is enough to insert a desired resistor Rgi between the gate-source circuit. The value of the resistor Rgi is selected such that Rgi.Ig becomes nearly equal to the reverse bias voltage applied to the gate, where Ig is a gate current. The resistor Rgi may be provided easily by using polysilicon.

The above matters are also true for the structures in FIGS. 1A and 1C TO 1E. It should be noted, however, that, in the case of the structure in FIG. 1C, the resistor is inserted between the p region 28 and the cathode region.

Figure 6A:
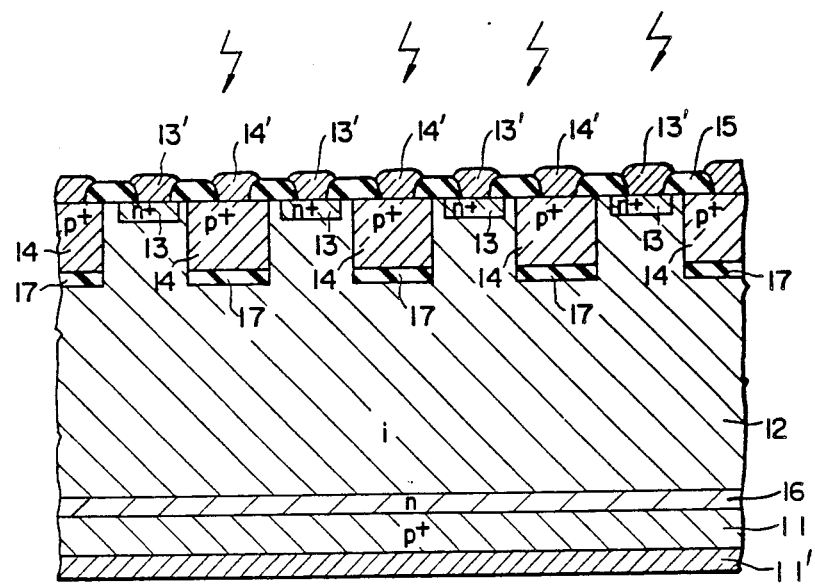
FIG. 6A shows another embodiment of the present invention.
Figure 6B:
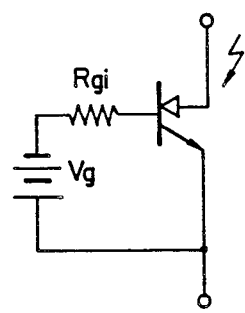
FIG. 6B is an equivalent circuit of the embodiment in FIG. 6A.

FIG. 6A is another another embodiment of the optically controllable SIT by which the gate current can be minimized while the main current can be increased and FIG. 6B is an equivalent circuit thereof.

In FIG. 6A, an insulating layer 17 of such as $SiO_2$ or $Si_3N_4$ is provided beneath the p+ gate region 14 and polysilicon resistor Rgi (not shown) is provided at a suitable position of the gate 14 extending vertically to the drawing sheet. The resistor Rgi to be connected to the gate may be externally provided.

Figure 7:
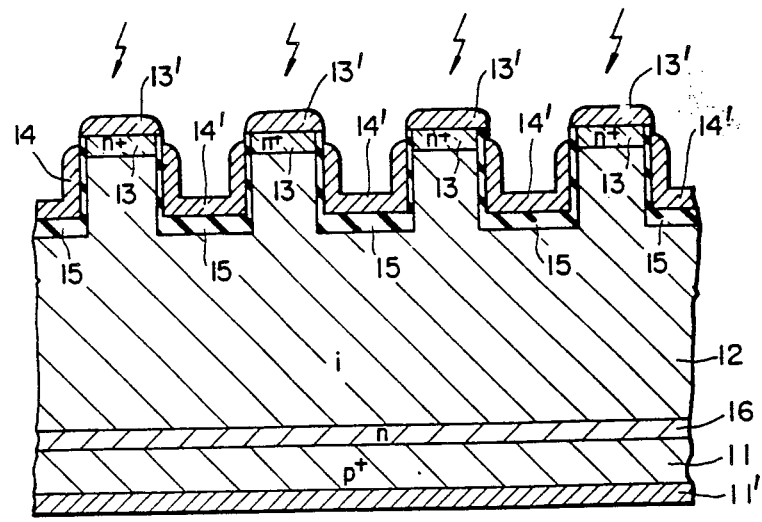
FIG. 7 shows another embodiment of the present invention.

FIG. 7 shows a modification of the embodiment in FIG. 6A, in which the potential barrier in the side of the cathode is diminished by an accumulation of carriers instead of the use of the resistor Rgi.

The negative voltage applied to the gate electrode 14' is completely masked by holes flowing into the vicinity of the gate and thus the potential barrier at the front face of the cathode disappears, resulting in an abrupt electron injection from the cathode. The mechanism of hole injection from the anode is the same as in the embodiment in FIG. 6A.

In FIGS. 6A and 7, the electrodes 13' and 14' are made of a material such as low resistance polysilicon, $In_2O_3$ or $SnO_2$ so that the cathode can be irradiated with light. With this structure, a heat sink can be provided in the anode side. If the heat sink problem is not important, the anode electrode may be made transparent and light directed. Alternatively, it is also possible to make both electrodes transparent so that light can be directed to it to either side.

Figure 8:
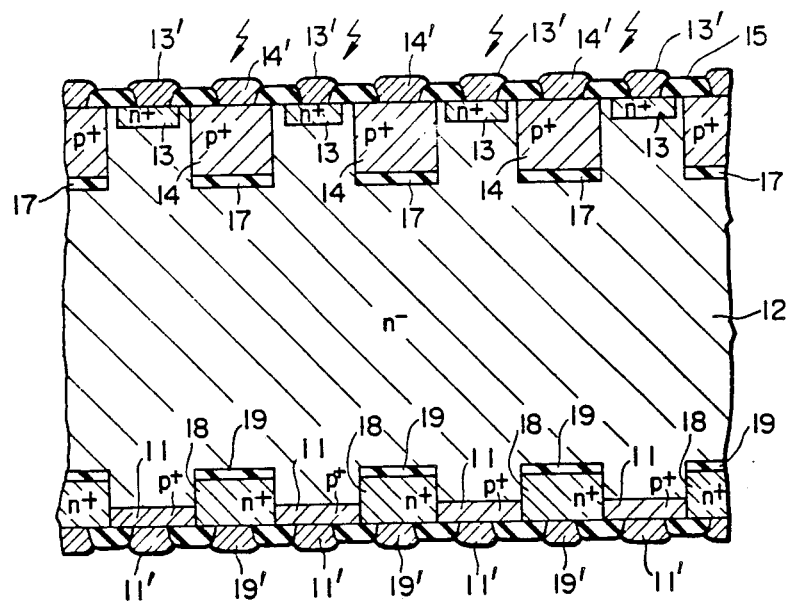
FIG. 8 shows an other embodiment of the present invention.

FIG. 8 shows another modification of the structure in FIG. 6A or 7 in which the gate structure is provided on only the cathode side.

In FIG. 8, the gate structure is also provided on the anode side. With this structure, electron accumulated in the n region 16 may not disappear due to recombination etc.

In FIG. 8, n+ gate region 18 are also provided adjacent the p+ anode region 11, and insulating regions 19 are provided inward of the n+ gate regions 18, respectively. In the case where a reverse bias is applied between the anode region 11 and the n+ region 18 similarly to the anode side, the region 12 may be a high resistance i region instead of the n+ region. In FIG. 8, a polysilicon resistor (not shown) is formed between the p+ region 11 and the n+ region 18. It may be possible, however, to connect the p+ anode region 11 directly to the n+ region 18 by using an electrode.

The SIT and the photo-sensitive semiconductor element to be connected to the gate of the SIT for controlling the latter between conduction and non-conduction can be formed together on the same silicon wafer, or they can be prepared as separate chips and then connected electrically with lead wires.

The impurity densities and the thicknesses of the regions 12 and 16 may be selected in the manner as described in Japanese Patent Application Nos. 54-8366 and 54-15757.

Although the optically controllable SIT according to the present invention has been described with reference to the preferred embodiments shown in the attached drawings, it may be practiced in other ways. For example, the conductivty types of the respective regions may be reversed. In such case, the polarities of the voltages to be applied thereto should also be reversed. Furthermore, when the SIT used is of the junction type, it is advisable, in view of reduction of capacitance and increase of breakdown voltage, to provide an insulating layer of such as $SiO_2$ between the cathode and anode.

Further, although the p+ gate region 14 in FIG. 1A or 1B is provided as being extended vertically to the drawing sheet, it may be possible to provide the gate region having a portion which is enlarged gradually in cross section with the distance from the surface. With such a structure of the p+ gate region, the voltage gain may be improved.

In the case of an SIT having a junction type gate, it may be possible to form a recess on a surface of a wafer and to provide a P+ region in the recess. A Schottky gate may be used instead of a P-N junction for this purpose.

As to the light source for controlling the SIT, it may be any, provided that electron-hole pairs can be produced in the semiconductor by light emitted thereby and that it can be switched at high speed. For example, it may be possible to use a solid laser, gas laser, semiconductor laser or light emissive diode of such as GaAlAs, InGaP, GaAsP, GaP, ZnSe or ZnS for this purpose.

The optically controllable SIT according to the present invention can be easily manufactured by using a conventional/photolithographic technique, diffusion technique, ion injection technique, crystallization technique, epitaxial growth technique, etching technique, oxidation technique, CVD technique and/or wiring technique etc.

The present invention by the SIT which can operate to switch a large voltage and a large current at high speed provides a very effective technique in connecting a plurality of the SITs in series and/or in parallel with each other and the industrial advantages of the present invention are remarkable.

What is claimed is:

1. An optically controllable semiconductor device, comprising at least one optically controllable unit for varying the conduction of a controllable current path connected in series between first and second output terminals of said semiconductor device, said optically controllable unit comprising:

a negative bias voltage source having first and second terminals, with said first terminal of said negative bias voltage source being at a lower potential than said second terminal of said negative bias voltage source;

a resistor having first and second terminals with its second terminal coupled to said first terminal of said negative bias voltage source to form a series connection;

a photo sensitive element having first and second terminals and having a conduction path between said first and second terminals which varies in accordance with optical irradiation of said photo sensitive element, said first terminal of said photo sensitive element being connected to said first terminal of said resistor and said second terminal of said photo sensitive element being connected to said second terminal of said negative bias voltage source, the connection point of said first terminals of said photo sensitive element and resistor providing an optically controlled bias voltage;

an optical source for irradiating said photo sensitive element; and at least one static induction thyristor, said thyristor including a channel region (12) having a first region of relatively low impurity concentration and having a plurality of channel region portions within said first region, said channel region having first and second major surfaces, anode means comprising at least one highly-doped semiconductor anode region (11) of a first conductivity type formed adjacent said first major surface, cathode means comprising a plurality of highly-doped cathode regions (13) formed adjacent said second major surface and electrically connected to said second terminal of said negative bias voltage source, said anode, cathode and channel regions being disposed relative to one another in a semiconductor body so as to define respective current paths between said anode region and different ones of said cathode regions through respective portions of said first region, said respective current paths comprising said controllable current path, said static induction thyristor further including gate means responsive to said optically controlled bias voltage for generating depletion regions extending into said portions of said first region to control current flow through said current paths, said gate means comprising a plurality of gate portions (14) of said first conductivity type and having an impurity concentration throughout each gate portion of at least $1 \times 10^{19} cm^{-3}$, said gate portions being electrically connected to one another and to said first terminals of said photo sensitive element and resistor, said static induction thyristor turning off in response to a reverse bias between said gate portions and said cathode regions when said photosensitive element provides said bias voltage to said gate means upon irradiation of said photosensitive element for quenching said static induction thyristor.

2. An optically controllable semiconductor device according to claim 1, wherein said gate portions are connected to said first terminals of said photo sensitive element and resistor via a gate electrode, with each of said gate portions being exposed adjacent said second major surface and being connected electrically to said gate electrode.

3. An optically controllable semiconductor device according to claim 1, wherein said static induction thyristor has an insulated gate structure.

4. An optically controllable semiconductor device according to claim 1, wherein said channel region includes a thin semiconductor layer (16) of a conductivity type different from said first conductivity type sandwiched between said anode region and said first region, said thin layer having an impurity concentration higher than that of said first region and having a thickness much smaller than that of said first region.

5. An optically controllable semiconductor device as claimed in claim 4, wherein said different conductivity type is opposite said first conductivity type and wherein said anode means comprises a plurality of said anode regions and at least one further highly-doped semiconductor region of said different conductivity type separating said plurality of anode regions, said plurality of anode regions each being disposed at a position opposite one of said cathode regions, and each said further semiconductor region being formed at a position opposite one of said gate portions.

6. An optically controllable semiconductor device as claimed in claim 1, said device comprising a plurality of said optically controllable units having their respective controllable current paths coupled in series with one another between said first and second output terminals of said device.

7. An optically controllable semiconductor device as claimed in claim 6, each said optically controllable unit further comprising a resistor connected between said anode means and cathode means and having a resistance value slightly less than the resistance value of each static inductor thyristor when each static induction thyristor is in a non-conductive state.

8. An optically controllable semiconductor device as claimed in claim 6, said device further including a plurality of series connections of said optically controllable units connected in parallel with one another.

9. An optically controllable semiconductor device, comprising at least one optically controllable unit for varying the conduction of a controllable current path connected in series between first and second output terminals of said semiconductor device, said optically controllable unit comprising:

a negative bias voltage source having first and second terminals with said first terminal of said negative bias voltage source being at a lower potential than said second terminal of said negative bias voltage source;

an optical source for providing an irradiation; and at least one static induction thyristor, said thyristor including a channel region (12) having a first region of relatively low impurity concentration, said channel region having first and second major surfaces, anode means comprising at least one highly-doped semiconductor anode region (11) formed adjacent said first major surface and being of a first conductivity type, cathode means comprising a plurality of highly-doped cathode regions (13) formed adjacent said second major surface and electrically connected to said second terminal of said negative bias voltage means, said anode, cathode and channel regions being disposed relative to one another in a semiconductor body so as to define respective current paths between said anode region and different ones of said cathode regions through respective portions of said first region, said respective current paths comprising said controllable current paths, said static induction thyristor further including gate means responsive to optical irradiation of said second major surface for generating depletion layers extending into said portions of said first region to control current flow through said respective current paths, said gate means comprising a plurality of gate region portions (14) of said first conductivity type and having an impurity concentration throughout each gate region portion of at least $1 \times 10^{19} \text{cm}^{-3}$, said gate portions being electrically connected to one another and to said first terminal of said negative bias voltage means, said static induction thryistor turning off in response to a reverse bias between said gate portions and said cathode regions.

10. An optically controllable semiconductor device according to claim 9, wherein said gate portions are connected to said first terminal of said negative bias voltage means via a gate electrode, with each said gate region portion being exposed adjacent said second major surface and being connected electrically to said gate electrode.

11. An optically controllable semiconductor device according to claim 9, wherein said static induction thyristor has an insulated gate structure.

12. An optically controllable semiconductor device according to claim 9, wherein said channel region includes a thin semiconductor (16) of a conductivity type different from said first conductivity type sandwiched between said anode region and said first region, said thin layer having an impurity concentration higher than that of said first region and having a thickness much smaller than that of said first region.

13. An optically controllable semiconductor device as claimed in claim 12, wherein said anode means comprises a plurality of said anode regions and at least one further highly-doped semiconductor region of said different conductivity type separating said plurality of anode regions, said plurality of anode regions being disposed at a position opposite one of said cathode regions, and each said further semiconductor region being formed at a position opposite one of said gate portions.

14. An optically controllable semiconductor device as claimed in claim 11, further comprising recesses formed on said second major surface between successive ones of said plurality of cathode regions, said insulated gate structure being formed in each of said recesses.

15. An optically controllable semiconductor device according to claim 14, wherein said channel region includes a thin semiconductor layer (16) of a conductivity type different from said second conductivity type sandwiched between said anode region and said first region, said thin layer having an impurity concentration higher than that of said first region and having a thickness much smaller than that of said first region.

16. An optically controllable semiconductor device as claimed in claim 9, wherein said at least one anode region comprises a plurality of anode regions, said gate means comprising a first plurality of gate regions (14) in contact with said second major surface, said gate means further comprising a second plurality of regions (18) of a second conductivity type opposite said first conductivity type and disposed in contact with said first major surface and responsive to optical irradiation of said first major surface for generating depletion regions in said portions of said first region adjacent each of said anode regions, said anode regions being positioned opposite respective cathode regions and each of said second plurality of gate portions being disposed opposite respective ones of said first plurality of gate portions.

17. An optically controllable semiconductor device as claimed in claim 16, further comprising insulating layers (17, 19) between said channel region and at least part of each of said first and second pluralities of gate portions.

18. An optically controllable semiconductor device as claimed in claim 19, said device comprising a plurality of said optically controllable units having their respective controllable current paths coupled in series with one another between said first and second output terminals of said device.

19. An optically controllable semiconductor device as claimed in claim 18, each said optically controllable unit further comprising a resistor connected between said anode means and cathode means and having a resistance value slightly less than the resistance value of each static inductor thyristor when each static induction thyristor is in a non-conductive state.

20. An optically controllable semiconductor device as claimed in claim 18, said device further including a plurality of series connections of said optically controllable units connected in parallel with one another.

* * * * *